(12) United States Patent
Lee et al.

(10) Patent No.: US 11,730,064 B2
(45) Date of Patent: Aug. 15, 2023

(54) MAGNETIC MEMORY DEVICE

(71) Applicant: SAMSUNG ELECTRONICS CO., LTD., Suwon-si (KR)

(72) Inventors: Sung Chul Lee, Osan-si (KR); Whankyun Kim, Seoul (KR); Joonmyoung Lee, Gwacheon-si (KR); Junho Jeong, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 4 days.

(21) Appl. No.: 16/950,009

(22) Filed: Nov. 17, 2020

(65) Prior Publication Data

US 2021/0367142 A1 Nov. 25, 2021

(30) Foreign Application Priority Data

May 25, 2020 (KR) .................. 10-2020-0062605

(51) Int. Cl.
*H10N 52/80* (2023.01)
*G11C 11/18* (2006.01)
*G11C 11/16* (2006.01)
*H10B 61/00* (2023.01)
*H10N 52/00* (2023.01)
*H10N 52/01* (2023.01)

(52) U.S. Cl.
CPC .......... *H10N 52/80* (2023.02); *G11C 11/161* (2013.01); *G11C 11/1673* (2013.01); *G11C 11/1675* (2013.01); *G11C 11/18* (2013.01); *H10B 61/22* (2023.02); *H10N 52/00* (2023.02); *H10N 52/01* (2023.02)

(58) Field of Classification Search
CPC ....... H01L 43/04; H01L 27/228; H01L 43/06; H01L 43/08; H10N 52/80; H10N 52/00; H10B 61/22
See application file for complete search history.

(56) References Cited

U.S. PATENT DOCUMENTS

| | | |
|---|---|---|
| 8,889,433 B2 | 11/2014 | De Brosse et al. |
| 8,896,041 B2 | 11/2014 | De Brosse et al. |
| 9,076,537 B2 | 7/2015 | Khvalkovskiy et al. |
| 10,211,393 B2 | 2/2019 | Mihajlovic et al. |
| 10,490,247 B2 | 11/2019 | Nakatsuji |
| 10,490,736 B2 | 11/2019 | Saito et al. |
| 10,497,417 B2 | 12/2019 | Sasaki et al. |

(Continued)

OTHER PUBLICATIONS

Sato, Nature Electronics, vol. 1, Sep. 2018, pp. 508-511.

*Primary Examiner* — Latanya N Crawford Eason
(74) *Attorney, Agent, or Firm* — Lee IP Law, P.C.

(57) ABSTRACT

A magnetic memory device including a lower electrode on a substrate; a conductive line on the lower electrode; and a magnetic tunnel junction pattern on the conductive line, wherein the conductive line includes a first conductive line adjacent to the magnetic tunnel junction pattern; a second conductive line between the lower electrode and the first conductive line; and a high resistance layer at least partially between the first conductive line and the second conductive line, a resistivity of the second conductive line is lower than a resistivity of the first conductive line, and a resistivity of the high resistance layer is higher than the resistivity of the first conductive line and higher than the resistivity of the second conductive line.

15 Claims, 12 Drawing Sheets

(56) References Cited

U.S. PATENT DOCUMENTS

| | | | |
|---|---|---|---|
| 10,529,399 B2 | 1/2020 | Ohsawa et al. | |
| 2018/0123026 A1* | 5/2018 | Sasaki | H01F 10/3286 |
| 2020/0006637 A1* | 1/2020 | Gosavi | H01L 43/10 |
| 2021/0158849 A1* | 5/2021 | Saito | H01L 27/105 |
| 2021/0167278 A1* | 6/2021 | Ishitani | H01L 43/12 |
| 2021/0367143 A1* | 11/2021 | Lee | H01L 43/02 |

* cited by examiner

MAGNETIC MEMORY DEVICE

CROSS-REFERENCE TO RELATED APPLICATION

Korean Patent Application No. 10-2020-0062605, filed on May 25, 2020, in the Korean Intellectual Property Office, and entitled: "Magnetic Memory Device," is incorporated by reference herein in its entirety.

BACKGROUND

1. Field

Embodiments relate to a magnetic memory device.

2. Description of the Related Art

As the demand for electronic devices with increased speed and/or reduced power consumption increases, the demand for semiconductor memory devices with faster operating speeds and/or lower operating voltages is also increasing. A magnetic memory device has been considered to satisfy such a demand. The magnetic memory device may provide technical advantages, e.g., high speed and/or non-volatility, and the magnetic memory device is emerging as a next-generation memory device.

SUMMARY

The embodiments may be realized by providing a magnetic memory device including a lower electrode on a substrate; a conductive line on the lower electrode; and a magnetic tunnel junction pattern on the conductive line, wherein the conductive line includes a first conductive line adjacent to the magnetic tunnel junction pattern; a second conductive line between the lower electrode and the first conductive line; and a high resistance layer at least partially between the first conductive line and the second conductive line, a resistivity of the second conductive line is lower than a resistivity of the first conductive line, and a resistivity of the high resistance layer is higher than the resistivity of the first conductive line and higher than the resistivity of the second conductive line.

The embodiments may be realized by providing a magnetic memory device including a lower electrode on a substrate; a conductive line on the lower electrode; and a magnetic tunnel junction pattern on the conductive line, wherein the conductive line includes a first conductive line adjacent to the magnetic tunnel junction pattern; and a second conductive line between the lower electrode and the first conductive line, the first conductive line includes a topological insulator, and a resistivity of the second conductive line is smaller than a resistivity of the first conductive line.

The embodiments may be realized by providing a magnetic memory device including a conductive line on a substrate; and a magnetic tunnel junction pattern on the conductive line, wherein the conductive line includes a first conductive line adjacent to the magnetic tunnel junction pattern; and a second conductive line spaced apart from the magnetic tunnel junction pattern with the first conductive line therebetween, the first conductive line is configured to exert a spin-orbit torque on the magnetic tunnel junction pattern, and a resistivity of the second conductive line is lower than a resistivity of the first conductive line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
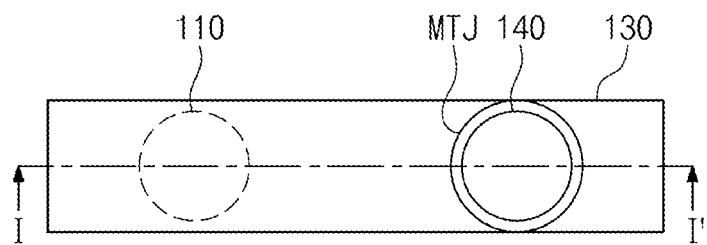
FIG. 1 is a plan view of a magnetic memory device according to an embodiment.
Figure 2:
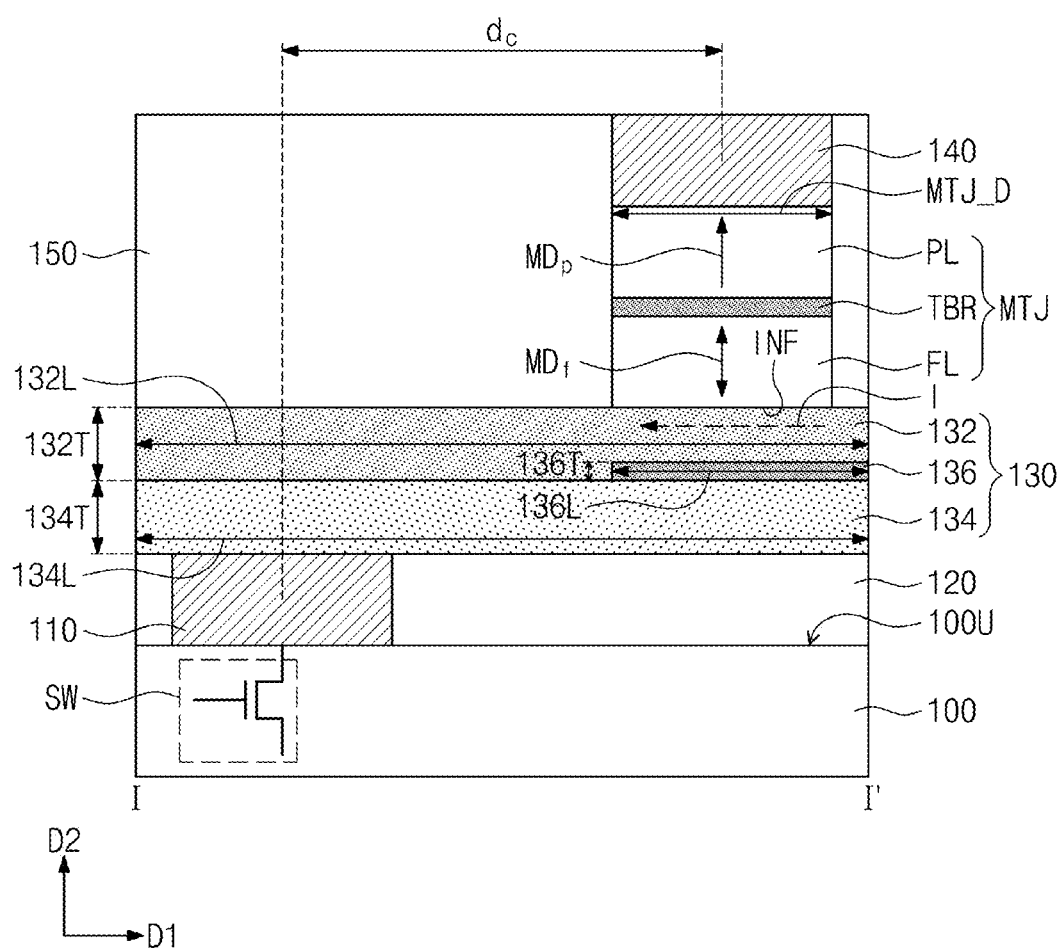
FIG. 2 is a sectional view taken along a line I-I' of FIG. 1.

FIG. 1 is a plan view of a magnetic memory device according to an embodiment, and FIG. 2 is a sectional view taken along a line I-I' of FIG. 1.

Referring to FIGS. 1 and 2, a lower electrode 110 may be on a substrate 100. The substrate 100 may include a semiconductor substrate. In an implementation, the substrate 100 may further include a conductive layer or an insulating layer on the semiconductor substrate. The semiconductor substrate may be formed of or include, e.g., silicon (Si), silicon germanium (SiGe), germanium (Ge), or gallium arsenide (GaAs), or may include a silicon-on-insulator (SOI) wafer. The lower electrode 110 may be formed of or include, e.g., doped semiconductor materials (e.g., doped silicon), metallic materials (e.g., tungsten, titanium, or tantalum), metal-semiconductor compounds (e.g., metal silicide), or conductive metal nitrides (e.g., titanium nitride, tantalum nitride, or tungsten nitride). As used herein, the term "or" is not an exclusive term, e.g., "A or B" would include A, B, or A and B.

A selection element SW may be in the substrate 100. The selection element SW may be, e.g., a field effect transistor. The lower electrode 110 may be electrically connected to one terminal of the selection element SW.

A lower interlayer insulating layer 120 may be on the substrate 100 to cover a side surface of the lower electrode 110. The lower interlayer insulating layer 120 may expose a top surface of the lower electrode 110, and the top surface of the lower electrode 110 may be substantially coplanar with a top surface of the lower interlayer insulating layer 120. The lower interlayer insulating layer 120 may be formed of or include, e.g., an oxide, a nitride, or an oxynitride.

A conductive line 130 may be on the lower electrode 110. The conductive line 130 may be electrically connected to the lower electrode 110 and may be in contact with the top surface of the lower electrode 110. The conductive line 130 may extend onto the lower interlayer insulating layer 120 in a first direction D1, which is parallel to a top surface 100U of the substrate 100.

The conductive line 130 may include a first conductive line 132 on the lower electrode 110, a second conductive line 134 between the lower electrode 110 and the first conductive line 132, and a high resistance layer 136 between the first conductive line 132 and the second conductive line 134. The second conductive line 134 may be in contact with the top surface of the lower electrode 110. A resistivity of the second conductive line 134 may be lower than that of the first conductive line 132, and the resistivity of the high resistance layer 136 may be higher than that of each of the first conductive line 132 and the second conductive line 134.

In an implementation, the first conductive line 132 may be formed of or include, e.g., a material whose resistivity ranges from about 0.001 Ωcm to about 0.05 Ωcm. In an implementation, the first conductive line 132 may be formed of or include, e.g., a topological insulator containing Bi, Se, or Sb. In an implementation, the first conductive line 132 may be formed of or include, e.g., BiSe or BiSb. In an implementation, the second conductive line 134 may be formed of or include a material whose resistivity ranges from about 1 μΩcm to about 10 μΩcm. In an implementation, the second conductive line 134 may be formed of or include, e.g., a metal or a metal alloy whose resistivity is lower than the first conductive line 132. In an implementation, the second conductive line 134 may be formed of or include, e.g., Al, Ir, Ru, Pt, Ta, or Hf. In an implementation, the high resistance layer 136 may be formed of or include, e.g., a material whose resistivity ranges from about 0.01 Ωcm to about 1 Ωcm. In an implementation, the high resistance layer 136 may be formed of or include, e.g., an oxide. In an implementation, the high resistance layer 136 may be formed of or include a metal oxide, e.g., MgO, TiO, RuO, or AlO.

Each of the first and second conductive lines 132 and 134 may extend (e.g., lengthwise) onto the lower interlayer insulating layer 120 in the first direction D1. The high resistance layer 136 may be between the first and second conductive lines 132 and 134 and may also extend in the first direction D1. Each of the first conductive line 132, the second conductive line 134, and the high resistance layer 136 may have a length in the first direction D1. In an implementation, a length 136L of the high resistance layer 136 may be smaller than a length 132L of the first conductive line 132 and smaller than a length 134L of the second conductive line 134. In an implementation, a portion of the first conductive line 132 may be in direct contact with a portion of the second conductive line 134. The high resistance layer 136 may be between another portion of the first conductive line 132 and another portion of the second conductive line 134.

Each of the first conductive line 132, the second conductive line 134, and the high resistance layer 136 may have a thickness in a second direction D2 perpendicular to the top surface 100U of the substrate 100. In an implementation, a thickness 136T of the high resistance layer 136 may be smaller than a thickness 132T of the first conductive line 132 and smaller than a thickness 134T of the second conductive line 134. The thickness 134T of the second conductive line 134 may be smaller than or equal to the thickness 132T of the first conductive line 132. In an implementation, the thickness 132T of the first conductive line 132 may range from 1 nm to 10 nm. The thickness 134T of the second conductive line 134 may range from 1 nm to 10 nm and may be smaller than or equal to the thickness 132T of the first conductive line 132. The thickness 136T of the high resistance layer 136 may range from 0.1 nm to 1 nm and may be smaller than the thickness 132T of the first conductive line 132 and smaller than the thickness 134T of the second conductive line 134.

A magnetic tunnel junction pattern MTJ may be on the conductive line 130, and an upper electrode 140 may be on the magnetic tunnel junction pattern MTJ. The magnetic tunnel junction pattern MTJ may be between the conductive line 130 and the upper electrode 140. The magnetic tunnel junction pattern MTJ and the upper electrode 140 may be overlapped or aligned with each other vertically (e.g., in the second direction D2).

The first conductive line 132 may be adjacent or proximate to the magnetic tunnel junction pattern MTJ, and the second conductive line 134 may be spaced apart from or distal to the magnetic tunnel junction pattern MTJ, e.g., with the first conductive line 132 therebetween. The high resistance layer 136 may be between the first and second conductive lines 132 and 134, and at least a portion of the high resistance layer 136 may be overlapped with the magnetic tunnel junction pattern MTJ vertically (e.g., in the second direction D2). In an implementation, the high resistance layer 136 may be overlapped with an entire region of an interface INF between the magnetic tunnel junction pattern MTJ and the first conductive line 132 vertically (e.g., in the second direction D2). In an implementation, the magnetic tunnel junction pattern MTJ may have a diameter MTJ_D in the first direction D1, and a length 136L of the high resistance layer 136 in the first direction D1 may be 1.0 to 1.5 times a diameter MTJ_D of the magnetic tunnel junction pattern MTJ in the first direction D1.

In an implementation, the magnetic tunnel junction pattern MTJ and the upper electrode 140 may be offset (e.g., laterally offset) from the lower electrode 110 in the first direction D1. In an implementation, a distance (hereinafter, an offset distance dc) between a center of the lower electrode 110 and a center of the upper electrode 140 may be larger than 0 nm and may be smaller than 500 nm. The high resistance layer 136 may be offset from the lower electrode 110 in the first direction D1 and may be locally disposed below the magnetic tunnel junction pattern MTJ.

The magnetic tunnel junction pattern MTJ may include a reference magnetic pattern PL, a free magnetic pattern FL, and a tunnel barrier pattern TBR therebetween. In an implementation, the free magnetic pattern FL may be between the conductive line 130 and the tunnel barrier pattern TBR, and the reference magnetic pattern PL may be spaced apart from the free magnetic pattern FL with the tunnel barrier pattern TBR therebetween. In an implementation, the conductive line 130 may be closer to the free magnetic pattern FL than it is to the reference magnetic pattern PL. In an implementation, the reference magnetic pattern PL may be between the conductive line 130 and the tunnel barrier pattern TBR, and the free magnetic pattern FL may be spaced apart from the reference magnetic pattern PL with the tunnel barrier pattern TBR therebetween. In an implementation, the conductive line 130 may be closer to the reference magnetic pattern PL than it is to the free magnetic pattern FL. The tunnel barrier pattern TBR may be formed of or include, e.g., magnesium oxide, titanium oxide, aluminum oxide, magnesium zinc oxide, or magnesium boron oxide. Each of the reference and free magnetic patterns PL and FL may include at least one magnetic layer.

The reference magnetic pattern PL may include a reference layer having a magnetization direction MDp that is fixed to a specific direction. The free magnetic pattern FL may include a free layer having a magnetization direction MDf that can be changed to be parallel or antiparallel to the magnetization direction MDp of the reference magnetic pattern PL. The magnetization directions MDp and MDf of the reference and free magnetic patterns PL and FL may be substantially perpendicular to an interface between the tunnel barrier pattern TBR and the free magnetic pattern FL.

Each of the reference and free magnetic patterns PL and FL may be formed of or include an intrinsic perpendicular magnetic material or an extrinsic perpendicular magnetic material. The intrinsic perpendicular magnetic material may include a material exhibiting a perpendicular magnetization property, even when there is no external cause. The intrinsic perpendicular magnetic material may include, e.g., i) perpendicular magnetic materials (e.g., CoFeTb, CoFeGd, or CoFeDy), ii) perpendicular magnetic materials with $L1_0$ structure, iii) CoPt materials with hexagonal-close-packed structure, or iv) perpendicular magnetic structures. The perpendicular magnetic material with the $L1_0$ structure may include, e.g., $L1_0$ FePt, $L1_0$ FePd, $L1_0$ CoPd, or $L1_0$ CoPt. The perpendicular magnetic structures may include magnetic layers and non-magnetic layers that are alternatingly and repeatedly stacked. In an implementation, the perpendicular magnetic structure may include, e.g., (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2. The extrinsic perpendicular magnetic material may include a material, which exhibits an intrinsic in-plane magnetization property when there is no external cause but exhibits a perpendicular magnetization property by an external cause. In an implementation, a magnetic anisotropy, which results from interfacial characteristics between the reference or free magnetic pattern PL or FL and the tunnel barrier pattern TBR, may be used to induce the perpendicular magnetization property of the extrinsic perpendicular magnetic material. The extrinsic perpendicular magnetic material may be formed of or include, e.g., CoFeB. Each of the reference and free magnetic patterns PL and FL may be formed of or include, e.g., a Co Heusler alloys.

The upper electrode 140 may be formed of or include a metallic material (e.g., tungsten, titanium, or tantalum) or a conductive metal nitride (e.g., titanium nitride, tantalum nitride, or tungsten nitride).

The first conductive line 132 may be configured to exert a spin-orbit torque on the magnetic tunnel junction pattern MTJ. In an implementation, in the case where the first conductive line 132 includes a topological insulator, a current I may flow through a surface of the first conductive line 132; e.g., the current I may flow along a path adjacent to the interface INF between the first conductive line 132 and the magnetic tunnel junction pattern MTJ. The flow of the current I may be parallel to the interface INF between the first conductive line 132 and the magnetic tunnel junction pattern MTJ. In this case, a spin current caused by a spin Hall effect (e.g., a quantum spin Hall effect) may flow in a direction perpendicular to the interface INF, and in this case, the spin-orbit torque may be exerted on the magnetic tunnel junction pattern MTJ. The magnetization direction MDf of the free magnetic pattern FL may be switched by the spin-orbit torque.

To help reduce a critical current density (Jc) for the switching of the magnetization direction MDf of the free magnetic pattern FL, a material with a large spin Hall angle ($\theta_{SH}$) for the first conductive line 132 may be used. The spin Hall angle ($\theta_{SH}$) may be defined as an amount of a produced spin current over a current density applied to an object. A material with a large spin Hall angle, e.g., the topological insulator, may have relatively high resistivity. In the case where the first conductive line 132 is formed of a large spin Hall angle material, e.g., the topological insulator, it is possible to reduce a critical current density (Jc) for the switching of the free magnetic pattern FL, but the resistivity of the first conductive line 132 may be increased. In this case, a tunnel magnetoresistance (TMR) property of the magnetic tunnel junction pattern MTJ could be deteriorated.

In an implementation, the conductive line 130 may include the first and second conductive lines 132 and 134. The first conductive line 132 may be formed of or include a large spin Hall angle material, e.g. the topological insulator, and a critical current density (Jc) for the switching of the free magnetic pattern FL may be lowered. The second conductive line 134 may be formed of or include a material whose resistivity is smaller than the first conductive line 132. Accordingly, a total resistivity of the conductive line 130 may be reduced, and in this case, the TMR property of the magnetic tunnel junction pattern MTJ may be improved.

In an implementation, the conductive line 130 may further include the high resistance layer 136 between the first conductive line 132 and the second conductive line 134. The high resistance layer 136 may be configured to help increase an in-plane current flowing through the first conductive line 132. In this case, it may be possible to increase an amount of the current I (i.e., an in-plane current) flowing through the interface INF between the magnetic tunnel junction pattern MTJ and the first conductive line 132 and moreover to increase a magnitude of a spin-orbit torque exerted on the magnetic tunnel junction pattern MTJ. As a result, the switching operation of the magnetic tunnel junction pattern MTJ may be easily performed.

Accordingly, it may be possible to provide a spin-orbit-torque-based magnetic memory device with improved switching and tunnel-magnetoresistance properties.

An upper interlayer insulating layer 150 may cover not only the conductive line 130 but also side surfaces of the magnetic tunnel junction pattern MTJ and the upper electrode 140. The upper interlayer insulating layer 150 may be formed of or include, e.g., an oxide, a nitride, or an oxynitride. Upper interconnection lines may be on the upper interlayer insulating layer 150. The upper electrode 140 may be electrically connected to a corresponding one of the upper interconnection lines.

In an implementation, an interconnection structure may be between the substrate 100 and the lower electrode 110. The interconnection structure may include a plurality of interconnection lines, which are stacked on the substrate 100 in the second direction D2, and interconnection contacts between the interconnection lines. In this case, the lower electrode 110 may be electrically connected to a terminal of the selection element SW through a corresponding one of the interconnection lines and a corresponding one of the interconnection contacts. In an implementation, the lower electrode 110 may be directly connected to a terminal of the selection element SW.

Figure 3A:
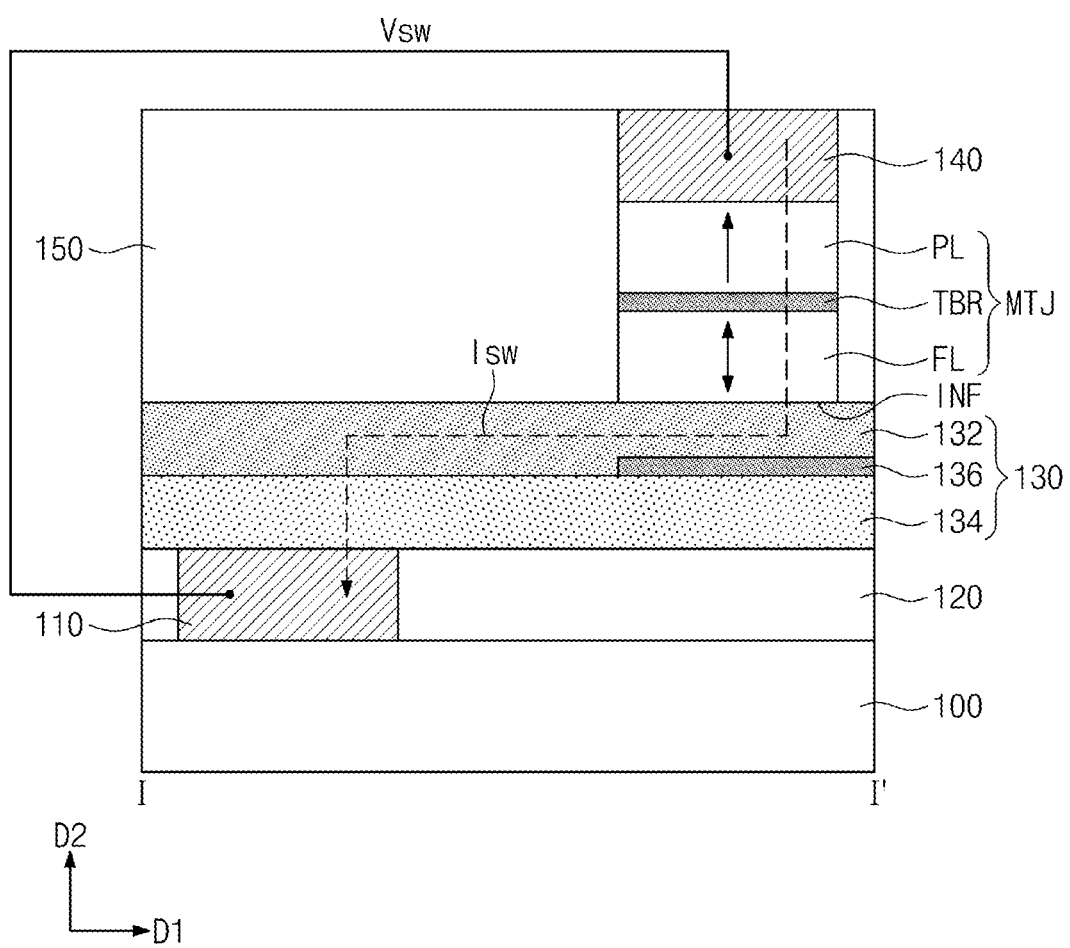
FIGS. 3A and 3B are conceptual diagrams of writing and reading operations of the magnetic memory device of FIG. 2.
Figure 3B:
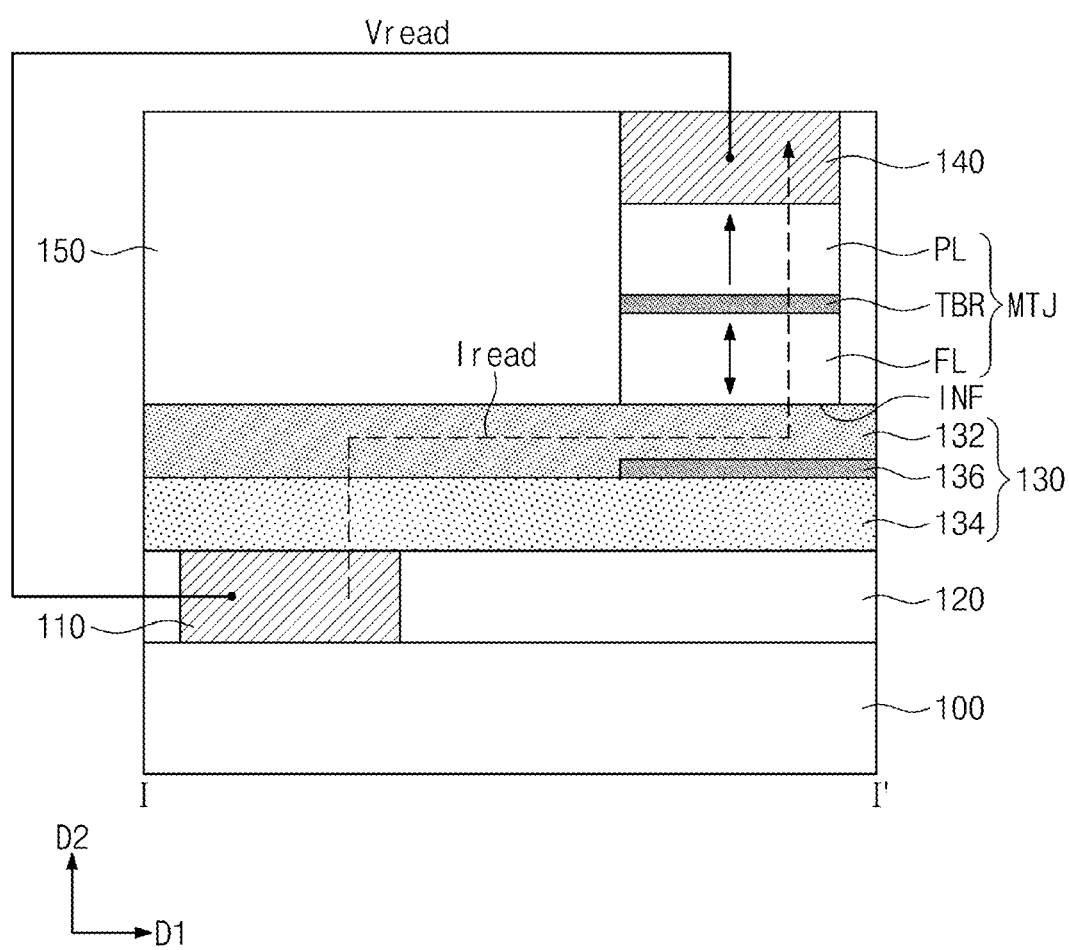

FIGS. 3A and 3B are conceptual diagrams of writing and reading operations on the magnetic memory device of FIG. 2.

Referring to FIG. 3A, a write voltage Vsw may be applied between the lower electrode 110 and the upper electrode 140, and a write current Isw may flow through the magnetic tunnel junction pattern MTJ and the conductive line 130. The write current Isw may flow along a path that is formed adjacent to and parallel to the interface INF between the first conductive line 132 and the magnetic tunnel junction pattern MTJ. In this case, a spin current caused by a spin Hall effect (e.g., a quantum spin Hall effect) may flow in a direction perpendicular to the interface INF, and in this case, a spin-orbit torque may be exerted on the magnetic tunnel junction pattern MTJ. The magnetization direction MDf of the free magnetic pattern FL may be switched to be parallel or antiparallel to the magnetization direction MDp of the reference magnetic pattern PL, by the spin-orbit torque produced by the write current Isw.

Referring to FIG. 3B, a read voltage Vread may be applied between the lower electrode 110 and the upper electrode 140, and a read current Iread may flow through the magnetic tunnel junction pattern MTJ and the conductive line 130. The read voltage Vread may be smaller than the write voltage Vsw. The read current Iread may pass through the magnetic tunnel junction pattern MTJ in a direction perpendicular to the interface INF between the first conductive line 132 and the magnetic tunnel junction pattern MTJ.

A resistance state of the magnetic tunnel junction pattern MTJ may be determined by sensing the read current Iread. In an implementation, the read current Iread may be used to determine whether the magnetic tunnel junction pattern MTJ is in a high resistance state or in a low resistance state. In an implementation, in the case where the magnetization direction MDf of the free magnetic pattern FL is parallel to the magnetization direction MDp of the reference magnetic pattern PL, the magnetic tunnel junction pattern MTJ may be in the low resistance state. In the case where the magnetization direction MDf of the free magnetic pattern FL is antiparallel to the magnetization direction MDp of the reference magnetic pattern PL, the magnetic tunnel junction pattern MTJ may be in the high resistance state. Such two resistance states of the magnetic tunnel junction pattern MTJ may be used as a binary data set of 0 and 1 to be stored in the magnetic tunnel junction pattern MTJ.

Figure 4:
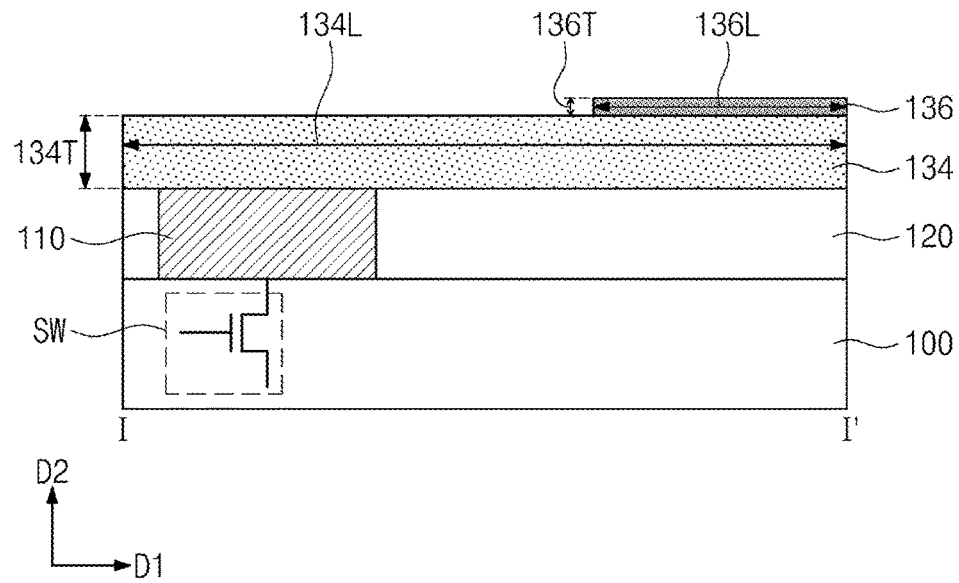
FIGS. 4 and 5 are sectional views taken along the line I-I' of FIG. 1 of stages in a method of fabricating a magnetic memory device, according to an embodiment.
Figure 5:
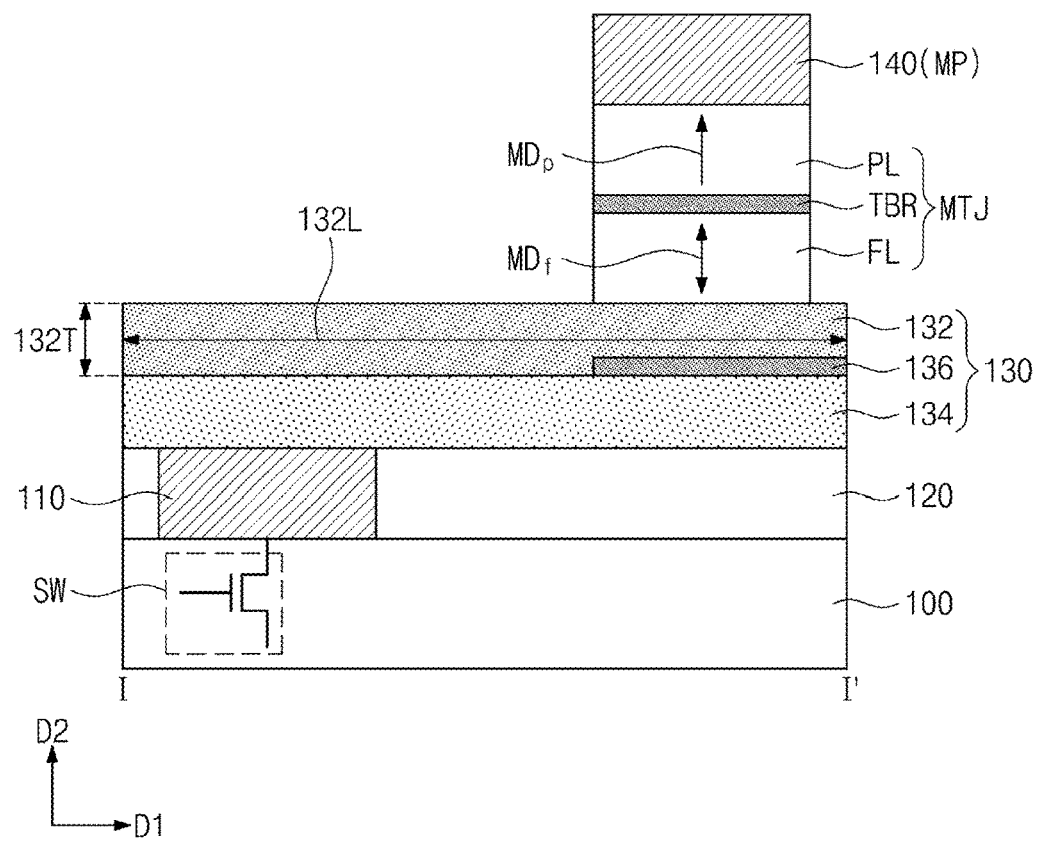

FIGS. 4 and 5 are sectional views taken along the line of FIG. 1 of stages in a method of fabricating a magnetic memory device, according to an embodiment. For the sake of brevity, features, which are different from the magnetic memory device of FIGS. 1, 2, 3A, and 3B, may be mainly described below.

Referring to FIGS. 1 and 4, a lower interlayer insulating layer 120 may be formed on a substrate 100, and a lower electrode 110 may be formed in the lower interlayer insulating layer 120. The substrate 100 may include a selection element SW. The lower electrode 110 may be connected the terminal of the selection element SW through the lower interlayer insulating layer 120. In an implementation, the formation of the lower electrode 110 may include forming a lower electrode hole in the lower interlayer insulating layer 120, forming a conductive layer on the lower interlayer insulating layer 120 to fill the lower electrode hole, and planarizing the conductive layer to expose a top surface of the lower interlayer insulating layer 120. As a result of the planarization process, the lower electrode 110 may have a top surface that is substantially coplanar with the top surface of the lower interlayer insulating layer 120.

A second conductive line 134 and a high resistance layer 136 may be sequentially formed on the lower interlayer insulating layer 120. In an implementation, the formation of the second conductive line 134 and the high resistance layer 136 may include sequentially depositing a second conductive layer and an intermediate layer on the lower electrode 110 and the lower interlayer insulating layer 120 and then patterning the second conductive layer and the intermediate layer. The second conductive layer and the intermediate layer may be formed by a chemical vapor deposition process or a physical vapor deposition process (e.g., a sputtering deposition process). The second conductive line 134 and the high resistance layer 136 may be respectively formed by the patterning of the second conductive layer and the intermediate layer. The patterning process may be performed to form each of the second conductive line 134 and the high resistance layer 136 in a line shape extending (e.g., lengthwise) in the first direction D1. In an embodiment, a length 136L of the high resistance layer 136 in the first direction D1 may be smaller than a length 134L of the second conductive line 134 in the first direction D1, and a thickness 136T of the high resistance layer 136 may be smaller than a thickness 134T of the second conductive line 134.

Referring to FIGS. 1 and 5, a first conductive line 132 may be formed on the second conductive line 134 and the high resistance layer 136. In an implementation, the formation of the first conductive line 132 may include depositing a first conductive layer on the substrate 100 (provided with the second conductive line 134 and the high resistance layer 136) and patterning the first conductive layer. The first conductive layer may be formed by, e.g., a sputtering deposition process or the like. The patterning process may be performed to form the first conductive line 132 in a line shape extending (e.g., lengthwise) in the first direction D1. In an implementation, a length 132L of the first conductive line 132 in the first direction D1 may be larger than a length 136L of the high resistance layer 136 in the first direction D1. Thus, a portion of the first conductive line 132 may be in direct contact with a portion of the second conductive line 134. A thickness 132T of the first conductive line 132 may be larger than a thickness 136T of the high resistance layer 136 and may be larger than or equal to a thickness 134T of the second conductive line 134.

The first conductive line 132, the second conductive line 134, and the high resistance layer 136 may constitute a conductive line 130. In an implementation, an additional interlayer insulating layer may be formed on the lower interlayer insulating layer 120 to cover a side surface of the conductive line 130.

A magnetic tunnel junction pattern MTJ and an upper electrode 140 may be formed on the conductive line 130. The magnetic tunnel junction pattern MTJ may include a reference magnetic pattern PL, a free magnetic pattern FL, and a tunnel barrier pattern TBR therebetween. In an implementation, the formation of the magnetic tunnel junction pattern MTJ and the upper electrode 140 may include forming a magnetic tunnel junction layer on the substrate 100 (provided with the conductive line 130), forming a conductive mask pattern MP on the magnetic tunnel junction layer, and etching the magnetic tunnel junction layer using the conductive mask pattern MP as an etch mask. The conductive mask pattern MP may define a shape and a position of a region, in which the magnetic tunnel junction pattern MTJ will be formed. The magnetic tunnel junction layer may include a free magnetic layer, a tunnel barrier layer, and a reference magnetic layer, which are sequentially stacked on the substrate 100 (provided with the conductive line 130). The magnetic tunnel junction layer may be formed by, e.g., a sputtering deposition process or the like. The free magnetic pattern FL, the tunnel barrier pattern TBR, and the reference magnetic pattern PL may be formed by the etching of the free magnetic layer, the tunnel barrier layer, and the reference magnetic layer, respectively. After the formation of the magnetic tunnel junction pattern MTJ, a portion of the conductive mask pattern MP may be left on the magnetic tunnel junction pattern MTJ and may be used as the upper electrode 140.

Referring back to FIGS. 1 and 2, an upper interlayer insulating layer 150 may be formed on the conductive line 130 to cover side surfaces of the magnetic tunnel junction pattern MTJ and the upper electrode 140. In an implementation, upper interconnection lines may be formed on the upper interlayer insulating layer 150. The upper electrode 140 may be electrically connected to a corresponding one of the upper interconnection lines.

Figure 6:
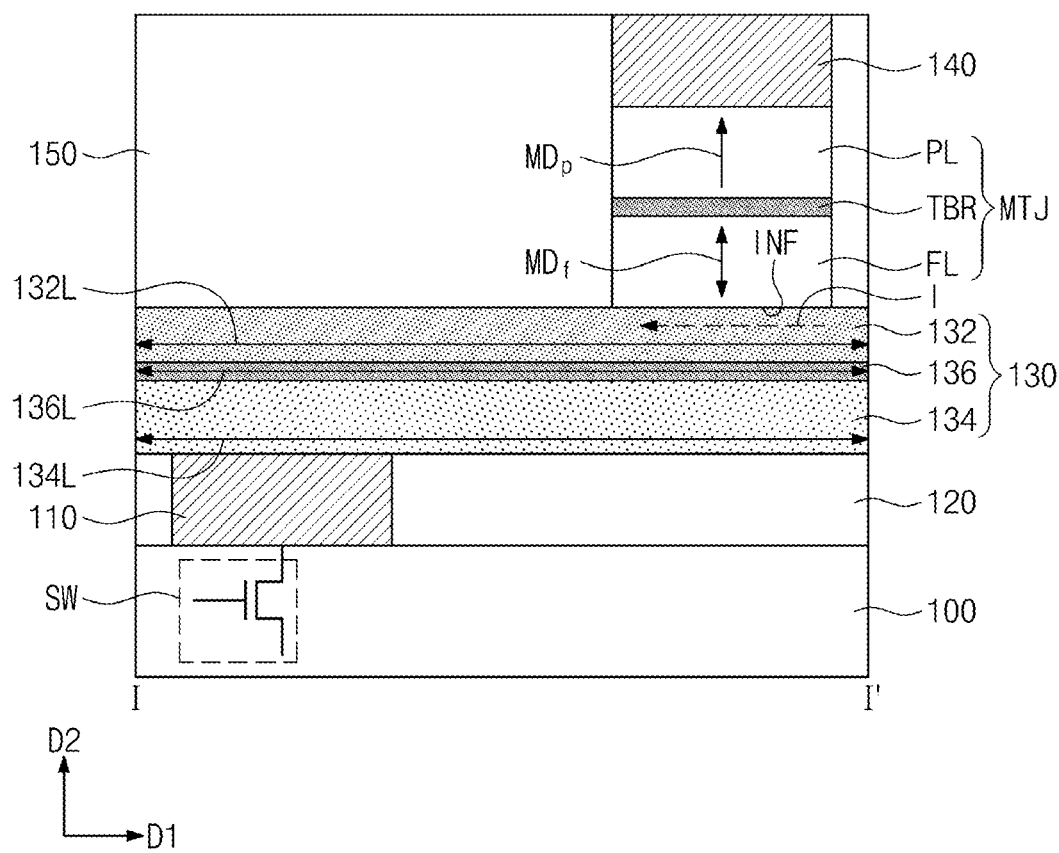
FIG. 6 is a sectional view taken along the line I-I' of FIG. 1 of a magnetic memory device according to an embodiment.

FIG. 6 is a sectional view taken along the line I-I' of FIG. 1 of a magnetic memory device according to an embodiment. For the sake of brevity, features, which are different from the magnetic memory device of FIGS. 1, 2, 3A, and 3B, may be mainly described below.

Referring to FIGS. 1 and 6, the first conductive line 132, the second conductive line 134, and the high resistance layer 136 may be on the lower electrode 110 and may extend onto the lower interlayer insulating layer 120 in the first direction D1. In an implementation, a length 136L of the high resistance layer 136 (e.g., in the first direction D1) may be substantially equal to a length 132L of the first conductive line 132 and a length 134L of the second conductive line 134 (e.g., in the first direction D1). The first conductive line 132 may be spaced apart from the second conductive line 134 with the high resistance layer 136 therebetween.

In an implementation, the magnetic tunnel junction pattern MTJ and the upper electrode 140 may be offset (e.g., laterally offset) from the lower electrode 110 in the first direction D1. A portion of the high resistance layer 136 may overlap with the magnetic tunnel junction pattern MTJ and the upper electrode 140 vertically (i.e., in the second direction D2), and another portion of the high resistance layer 136 may overlap with the lower electrode 110 vertically (i.e., in the second direction D2).

A method of fabricating a magnetic memory device according to the present embodiment may be substantially the same as the method described with reference to FIGS. 1, 2, 4, and 5, except that the high resistance layer 136 may be formed to have substantially the same length as the first and second conductive lines 132 and 134.

Figure 7:
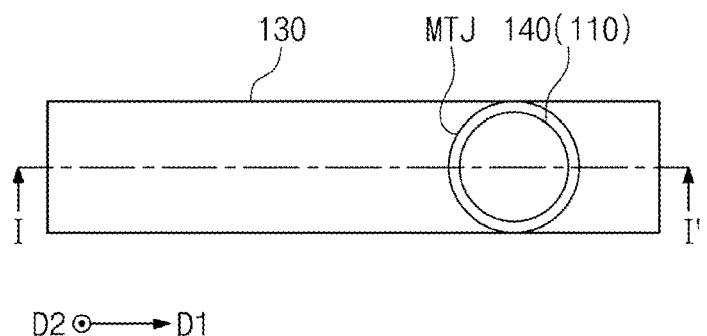
FIG. 7 is a plan view of a magnetic memory device according to an embodiment.
Figure 8:
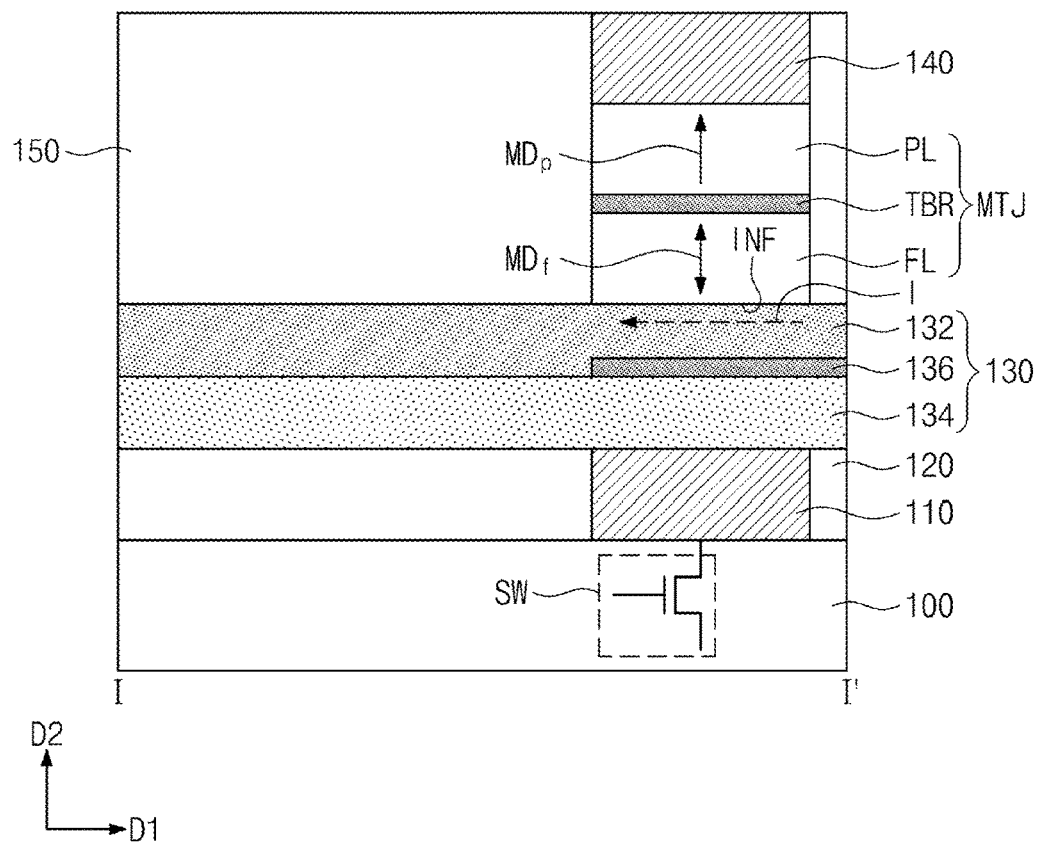
FIG. 8 is a sectional view taken along a line I-I' of FIG. 7.

FIG. 7 is a plan view of a magnetic memory device according to an embodiment, and FIG. 8 is a sectional view taken along a line of FIG. 7. For the sake of brevity, features, which are different from the magnetic memory device of FIGS. 1, 2, 3A, and 3B, will be mainly described below.

Referring to FIGS. 7 and 8, the lower electrode 110 may be aligned to the magnetic tunnel junction pattern MTJ and the upper electrode 140 vertically (i.e., in the second direction D2). In an implementation, a center of the lower electrode 110 may be aligned to a center of the upper electrode 140 vertically (i.e., in the second direction D2).

The high resistance layer 136 may be between the lower electrode 110 and the magnetic tunnel junction pattern MTJ and may overlap with the lower electrode 110, the magnetic tunnel junction pattern MTJ, and the upper electrode 140 vertically (i.e., in the second direction D2).

A method of fabricating a magnetic memory device according to the present embodiment may be substantially the same as the method described with reference to FIGS. 1, 2, 4, and 5, except for the afore-described difference in position of the lower electrode 110.

Figure 9:
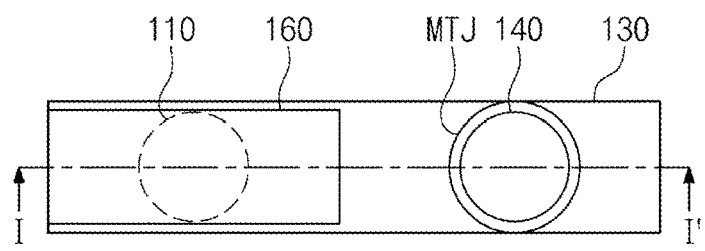
FIG. 9 is a plan view of a magnetic memory device according to an embodiment.
Figure 10:
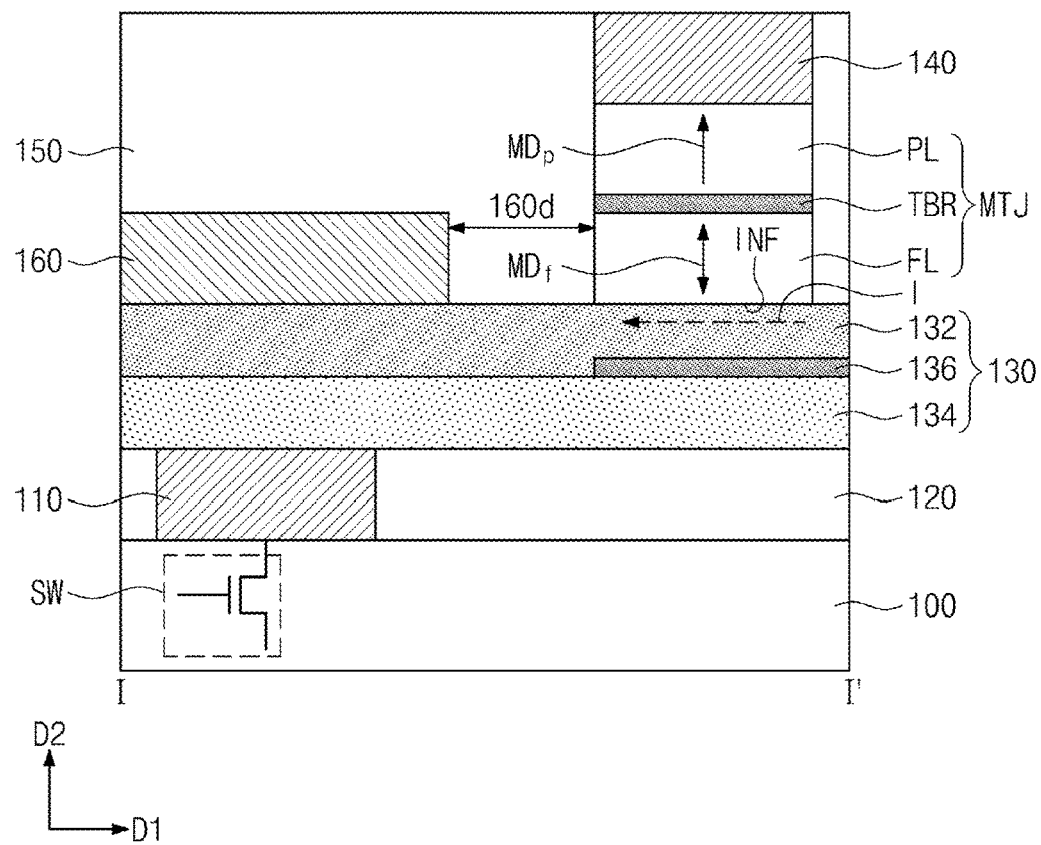
FIG. 10 is a sectional view taken along a line I-I' of FIG. 9.

FIG. 9 is a plan view of a magnetic memory device according to an embodiment, and FIG. 10 is a sectional view taken along a line I-I' of FIG. 9. For the sake of brevity, features, which are different from the magnetic memory device of FIGS. 1, 2, 3A, and 3B, may be mainly described below.

Referring to FIGS. 9 and 10, an upper conductive line 160 may be on the conductive line 130 and may be horizontally (e.g., laterally) spaced apart from the magnetic tunnel junction pattern MTJ. In an implementation, the magnetic tunnel junction pattern MTJ and the upper electrode 140 may be spaced apart from the upper conductive line 160 in the first direction D1. The upper conductive line 160 may be connected to the first conductive line 132. In an implementation, a distance 160d between the upper conductive line 160 and the magnetic tunnel junction pattern MTJ (in the first direction D1) may range from 1 nm to 35 nm.

Resistivity of the upper conductive line 160 may be lower than that of the first conductive line 132. The upper conductive line 160 may be formed of or include a metal or a metal alloy whose resistivity is lower than the first conductive line 132. In an implementation, the upper conductive line 160 may be formed of or include, e.g., Al, Ir, Ru, Pt, Ta, or Hf.

According to the present embodiments, the upper conductive line 160 may be on the first conductive line 132, and an in-plane current flowing through the first conductive line 132 may be increased. In an implementation, a current I (i.e., an in-plane current) passing through an interface INF between the magnetic tunnel junction pattern MTJ and the first conductive line 132 may be increased, and in this case, a magnitude of a spin-orbit torque exerted on the magnetic tunnel junction pattern MTJ may be increased. As a result, the switching operation of the magnetic tunnel junction pattern MTJ may be easily performed.

Figure 11:
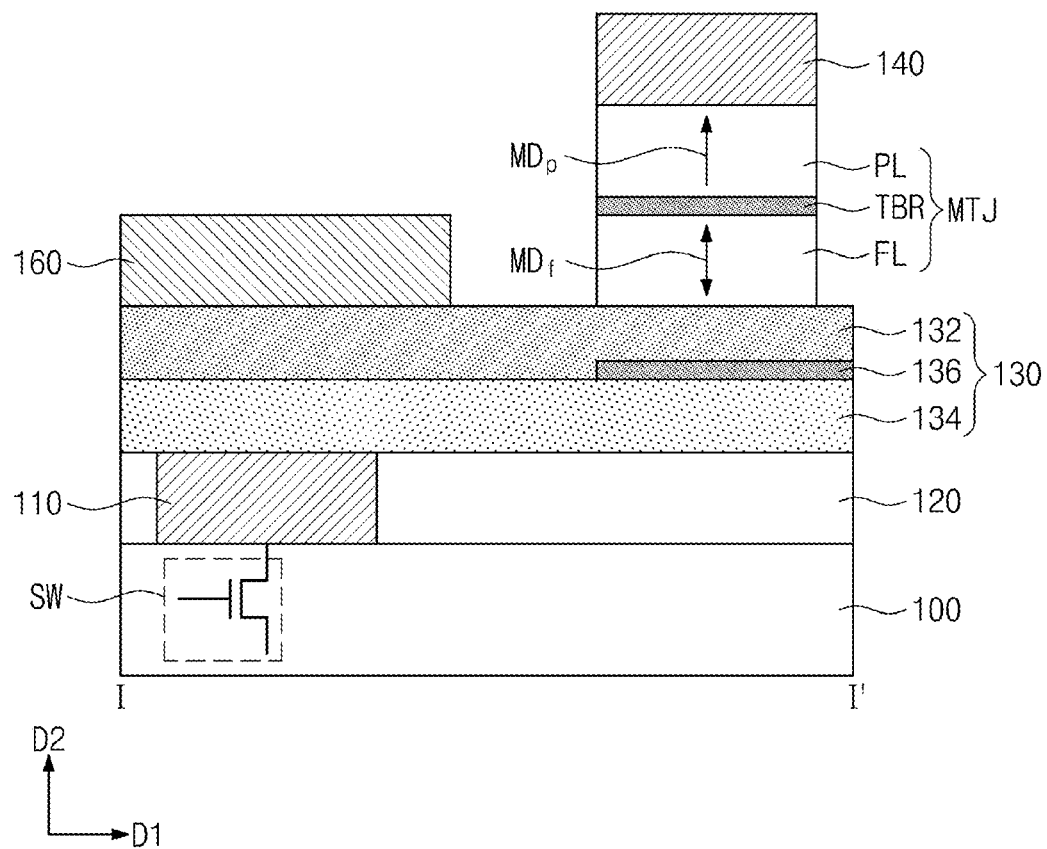
FIG. 11 is a sectional view taken along the line I-I' of FIG. 9 of a stage in a method of fabricating a magnetic memory device, according to an embodiment.

FIG. 11 is a sectional view taken along the line I-I' of FIG. 9 of a stage in a method of fabricating a magnetic memory device, according to an embodiment. For the sake of brevity, features, which are different from the method described with reference to FIGS. 1, 2, 4, and 5, may be mainly described below.

Referring to FIGS. 9 and 11, an upper conductive line 160 may be formed on the conductive line 130 to be horizontally spaced apart from the magnetic tunnel junction pattern MTJ. In an implementation, the formation of the upper conductive line 160 may include forming a mask layer on the conductive line 130 to cover the magnetic tunnel junction pattern MTJ, depositing an upper conductive layer on the conductive line 130, and patterning the upper conductive layer. The upper conductive line 160 may be formed by the patterning of the upper conductive layer, and the mask layer may be removed after the formation of the upper conductive line 160.

The upper conductive line 160 may be formed to be connected to or in contact with the first conductive line 132. The fabricating method according to the present embodiment may be substantially the same as the method described with reference to FIGS. 1, 2, 4, and 5, except that the upper conductive line 160 may be formed on the conductive line 130.

Figure 12:
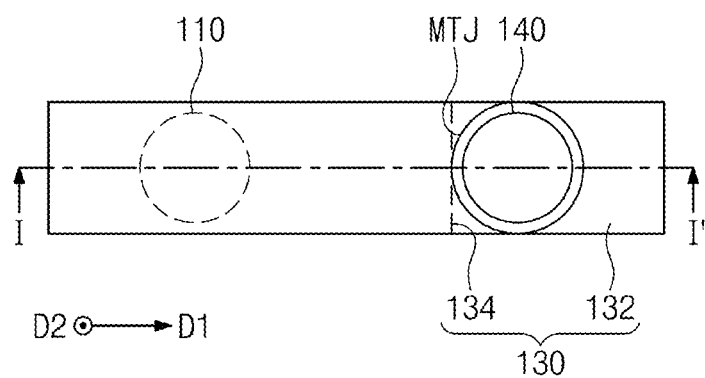
FIG. 12 is a plan view of a magnetic memory device according to an embodiment.
Figure 13:
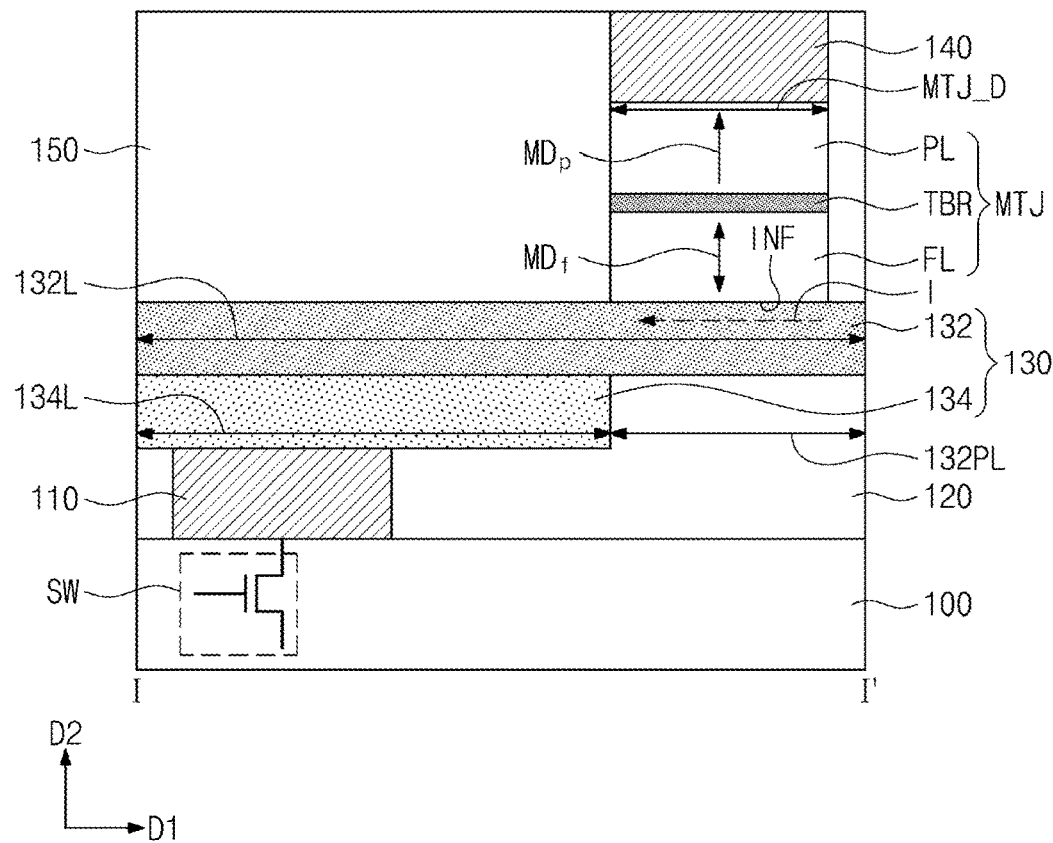
FIG. 13 is a sectional view taken along a line I-I' of FIG. 12.

FIG. 12 is a plan view of a magnetic memory device according to an embodiment, and FIG. 13 is a sectional view taken along a line I-I' of FIG. 12. For the sake of brevity, features, which are different from the magnetic memory device of FIGS. 1, 2, 3A, and 3B, may be mainly described below.

Referring to FIGS. 12 and 13, the conductive line 130 may include the first and second conductive lines 132 and 134, and the high resistance layer 136 may be omitted.

Each of the first and second conductive lines 132 and 134 may extend onto the lower interlayer insulating layer 120 in the first direction D1. Each of the first and second conductive lines 132 and 134 may have a length in the first direction D1. In an implementation, a length 134L of the second conductive line 134 may be smaller than a length 132L of the first conductive line 132. In this case, a bottom surface of the first conductive line 132 and a side surface of the second conductive line 134 may be in direct contact with the lower interlayer insulating layer 120.

At least a portion of the magnetic tunnel junction pattern MTJ may not overlap with the second conductive line 134 vertically (i.e., in the second direction D2). In an implementation, the magnetic tunnel junction pattern MTJ may be offset (e.g., laterally offset) from the second conductive line 134 in the first direction D1 and may not overlap with the second conductive line 134 vertically (i.e., in the second direction D2). In an implementation, the second conductive line 134 may not overlap with the entire region (e.g., may not overlap any part) of an interface INF between the magnetic tunnel junction pattern MTJ and the first conductive line 132 vertically (i.e., in the second direction D2).

A portion of the first conductive line 132 may further extend in the first direction D1, compared with or beyond the second conductive line 134, and may overlap with the magnetic tunnel junction pattern MTJ vertically (i.e., in the second direction D2). In an implementation, a length 132PL of the portion of the first conductive line 132 in the first direction D1 may be 1.0 to 1.5 times a diameter MTJ_D of the magnetic tunnel junction pattern MTJ in the first direction D1.

According to the present embodiment, the conductive line 130 may include the second conductive line 134 having a relatively small resistivity, and a total resistivity of the conductive line 130 may be reduced. In this case, the TMR property of the magnetic tunnel junction pattern MTJ may be improved. In addition, at least a portion of the magnetic tunnel junction pattern MTJ may not overlap with the second conductive line 134 vertically (i.e., in the second direction D2), and it may be possible to suppress an increase of an out-of-plane component of a current in the first conductive line 132 below the magnetic tunnel junction pattern MTJ. In an implementation, it may be possible to suppress a reduction of an in-plane current that flows through the first conductive line 132 below the magnetic tunnel junction pattern MTJ. Accordingly, the switching operation on the magnetic tunnel junction pattern MTJ may be more easily performed.

Figure 14:
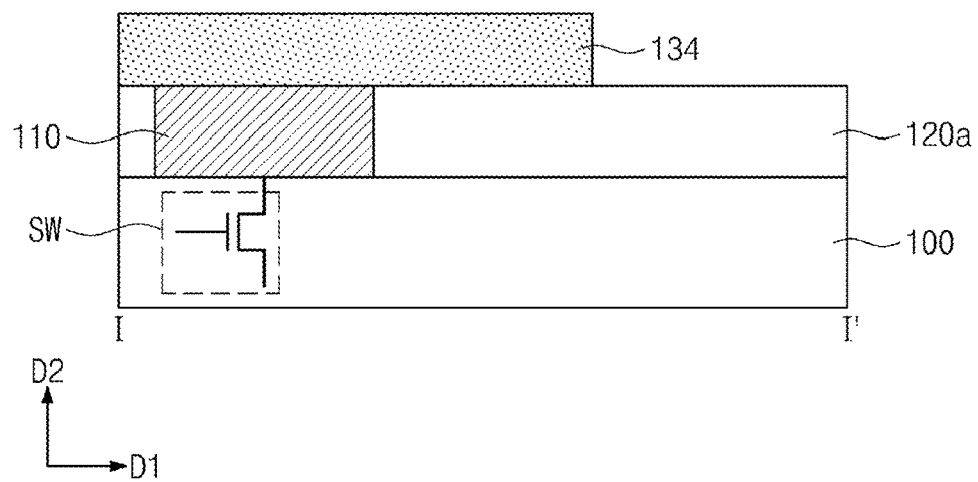
FIGS. 14 and 15 are sectional views taken along the line I-I' of FIG. 12 of stages in a method of fabricating a magnetic memory device, according to an embodiment.
Figure 15:
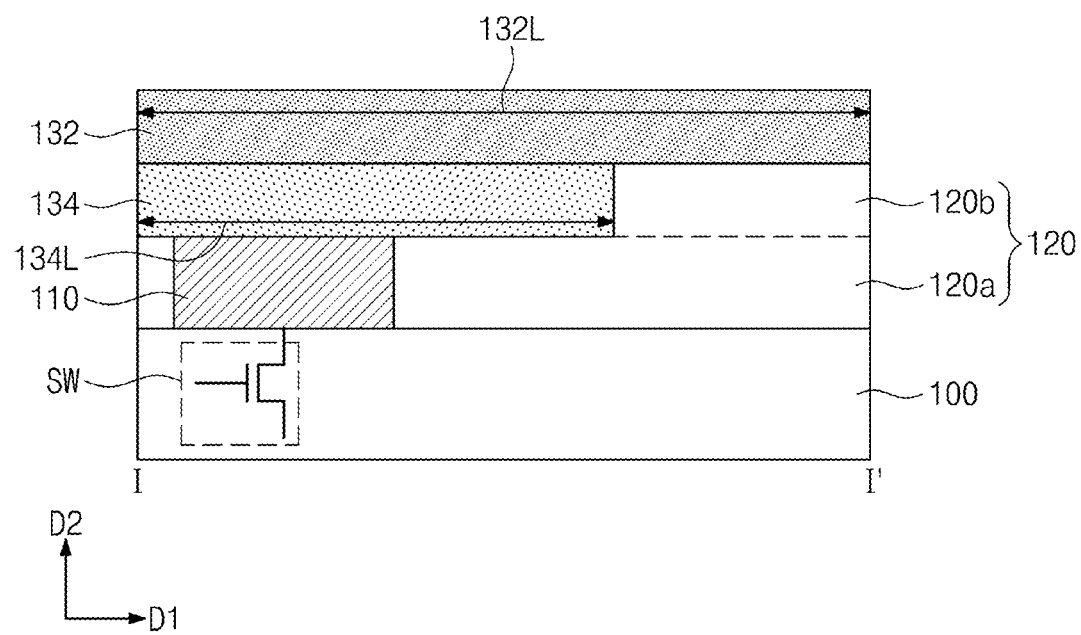

FIGS. 14 and 15 are sectional views taken along the line I-I' of FIG. 12 of stages in a method of fabricating a magnetic memory device, according to an embodiment. For the sake of brevity, features, which are different from the method described with reference to FIGS. 1, 2, 4, and 5, may be mainly described below.

Referring to FIGS. 12 and 14, a first lower interlayer insulating layer 120a may be formed on a substrate 100, and a lower electrode 110 may be formed in the first lower interlayer insulating layer 120a. The lower electrode 110 may be formed by substantially the same method as that for the lower electrode 110 described with reference to FIGS. 1 and 4.

A second conductive line 134 may be formed on the lower electrode 110 and may extend onto the first lower interlayer insulating layer 120a in the first direction D1. In an implementation, the formation of the second conductive line 134 may include depositing a second conductive layer on the lower electrode 110 and the first lower interlayer insulating layer 120a and patterning the second conductive layer. The patterning process may be performed to form the second conductive line 134 in a line shape extending in the first direction D1.

Referring to FIGS. 12 and 15, a second lower interlayer insulating layer 120b may be formed on the first lower interlayer insulating layer 120a to cover the second conductive line 134. In an implementation, the formation of the second lower interlayer insulating layer 120b may include forming an insulating layer on the first lower interlayer insulating layer 120a to cover the second conductive line 134 and planarizing the insulating layer to expose a top surface of the second conductive line 134. The second lower interlayer insulating layer 120b may cover a side surface of the second conductive line 134. As a result of the planarization process, the second lower interlayer insulating layer 120b may have a top surface that is substantially coplanar with a top surface of the second conductive line 134. The first and second lower interlayer insulating layers 120a and 120b may constitute a lower interlayer insulating layer 120.

A first conductive line 132 may be formed on the second conductive line 134 and may extend onto the lower interlayer insulating layer 120 (i.e., the second lower interlayer insulating layer 120b) in the first direction D1. In an implementation, the formation of the first conductive line 132 may include depositing a first conductive layer on the substrate 100 (provided with the second conductive line 134) and patterning the first conductive layer. The patterning process may be performed to form the first conductive line 132 in a line shape extending in the first direction D1. In an implementation, the first conductive line 132 may have a length 132L that is larger than a length 134L of the second conductive line 134, when measured in the first direction D1.

Except for the afore-described difference, a method of fabricating a magnetic memory device according to the present embodiment may be substantially the same as the method described with reference to FIGS. 1, 2, 4, and 5.

Figure 16:
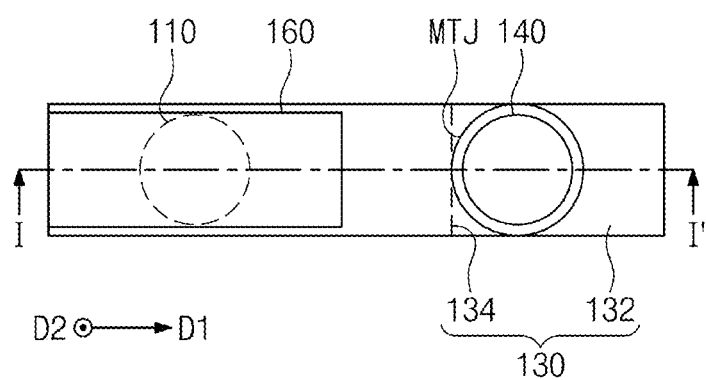
FIG. 16 is a plan view of a magnetic memory device according to an embodiment.
Figure 17:
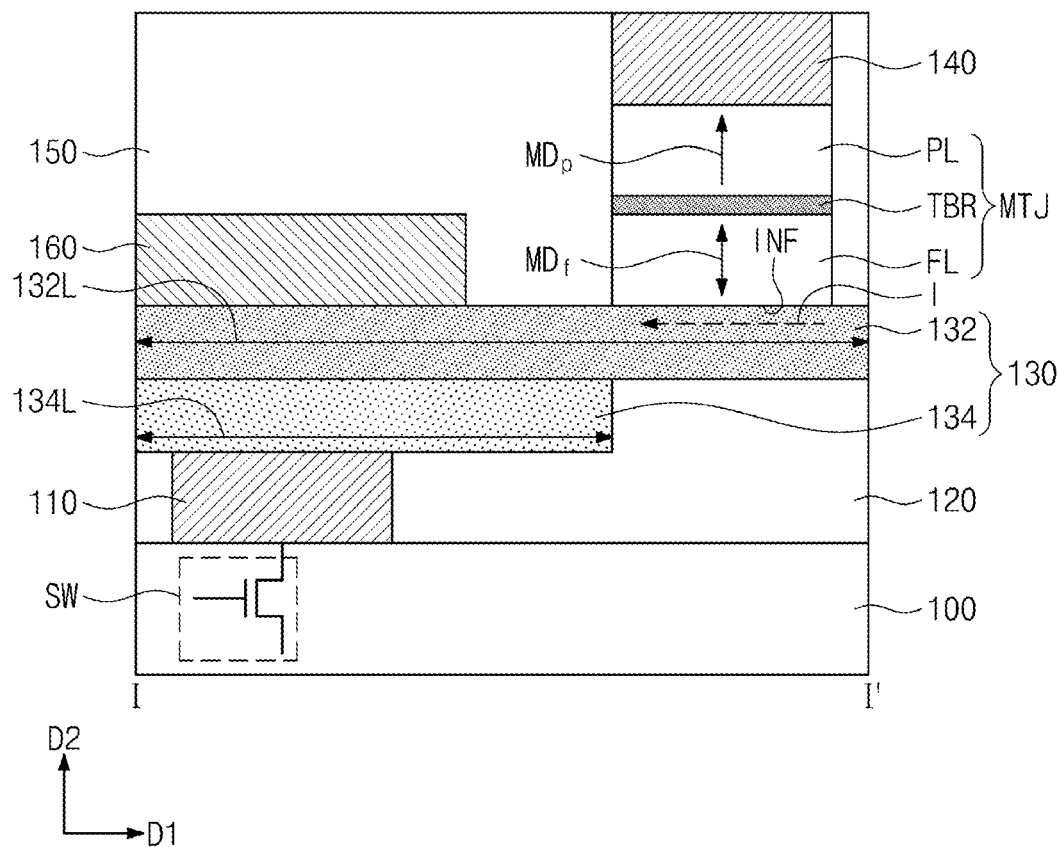
FIG. 17 is a sectional view taken along a line I-I' of FIG. 16.

FIG. 16 is a plan view of a magnetic memory device according to an embodiment, and FIG. 17 is a sectional view taken along a line I-I' of FIG. 16.

Referring to FIGS. 16 and 17, an upper conductive line 160 may be on the conductive line 130 and may be horizontally (e.g., laterally) spaced apart from the magnetic tunnel junction pattern MTJ. In an implementation, the magnetic tunnel junction pattern MTJ and the upper electrode 140 may be spaced apart from the upper conductive line 160 in the first direction D1. The upper conductive line 160 may be connected to the first conductive line 132. The upper conductive line 160 may be substantially the same as the upper conductive line 160 described with reference to FIGS. 9 and 10. The magnetic memory device according to the present embodiments may be substantially the same as that described with reference to FIGS. 12 and 13, except for the afore-described difference.

Figure 18:
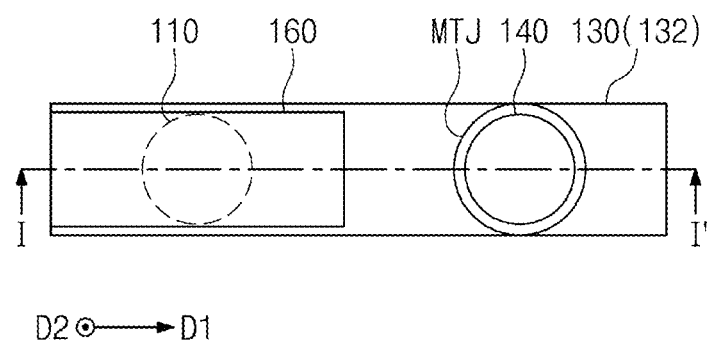
FIG. 18 is a plan view of a magnetic memory device according to an embodiment.
Figure 19:
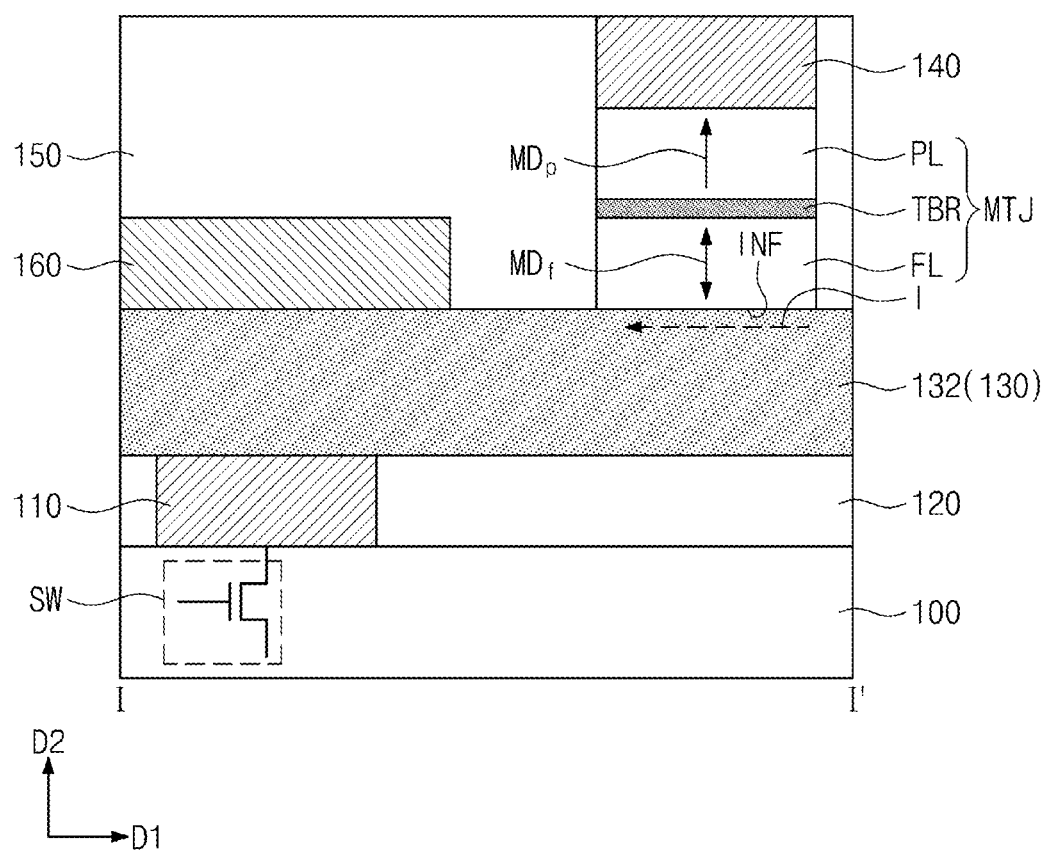
FIG. 19 is a sectional view taken along a line I-I' of FIG. 18.

FIG. 18 is a plan view of a magnetic memory device according to an embodiment, and FIG. 19 is a sectional view taken along a line I-I' of FIG. 18. For the sake of brevity, features, which are different from the magnetic memory device of FIGS. 1, 2, 3A, and 3B, may be mainly described below.

Referring to FIGS. 18 and 19, the conductive line 130 may include the first conductive line 132. In an implementation, the second conductive line 134 and the high resistance layer 136 may be omitted. The first conductive line 132 may be on the lower electrode 110 and may extend onto the lower interlayer insulating layer 120 in the first direction D1.

The magnetic tunnel junction pattern MTJ may be on the conductive line 130 (i.e., the first conductive line 132), and the upper electrode 140 may be on the magnetic tunnel junction pattern MTJ. An upper conductive line 160 may be on the conductive line 130 (i.e., the first conductive line 132) and may be horizontally spaced apart from the magnetic tunnel junction pattern MTJ. The magnetic tunnel junction pattern MTJ and the upper electrode 140 may be spaced apart from the upper conductive line 160 in the first direction D1. The upper conductive line 160 may be connected to the conductive line 130 (i.e., the first conductive line 132). The upper conductive line 160 may be substantially the same as the upper conductive line 160 described with reference to FIGS. 9 and 10.

According to the present embodiment, the upper conductive line 160 may be on the conductive line 130 (i.e., the first conductive line 132), and an in-plane current flowing through the conductive line 130 may be increased. In an implementation, a current I (i.e., an in-plane current) flowing through an interface INF between the magnetic tunnel junction pattern MTJ and the conductive line 130 may be increased, and in this case, a magnitude of a spin-orbit torque exerted on the magnetic tunnel junction pattern MTJ may be increased. As a result, the switching operation of the magnetic tunnel junction pattern MTJ may be easily performed.

According to an embodiment, a conductive line 130 may be below a magnetic tunnel junction pattern MTJ, and the conductive line 130 may include a first conductive line 132 and a second conductive line 134. The first conductive line 132 may be adjacent to the magnetic tunnel junction pattern MTJ, and the second conductive line 134 may be spaced apart from the magnetic tunnel junction pattern MTJ with the first conductive line 132 therebetween. The first conductive line 132 may be formed of or include a large spin Hall angle material, e.g., a topological insulator, and in this case, it may be possible to reduce a critical current density (Jc) for the switching of the magnetic tunnel junction pattern MTJ. The second conductive line 134 may be formed of or include a material whose resistivity is smaller than the first conductive line 132. Accordingly, a total resistivity of the conductive line 130 may be reduced, and in this case, the TMR property of the magnetic tunnel junction pattern MTJ may be improved.

In an implementation, the conductive line 130 may further include a high resistance layer 136 between the first conductive line 132 and the second conductive line 134. The high resistance layer 136 may help increase an amount of an in-plane current flowing through an interface INF between the magnetic tunnel junction pattern MTJ and the first conductive line 132, and in this case, a magnitude of a spin-orbit torque exerted on the magnetic tunnel junction pattern MTJ may be increased. As a result, the switching operation of the magnetic tunnel junction pattern MTJ may be easily performed.

Accordingly, it may be possible to provide a spin-orbit-torque-based magnetic memory device with improved switching and tunnel-magnetoresistance properties.

According to an embodiment, a conductive line may be below a magnetic tunnel junction pattern, and the conductive line may include a first conductive line and a second conductive line. The first conductive line may be formed of or include a material with a large spin Hall angle, and in this case, it may be possible to reduce a critical current density (Jc) for a switching operation on the magnetic tunnel junction pattern. The second conductive line may include a material whose resistivity is lower than the first conductive line. Thus, a total resistivity of the conductive line may be decreased, and a tunnel magnetoresistance (TMR) property of the magnetic tunnel junction pattern may be improved.

In an implementation, the conductive line may further include a high resistance layer between the first conductive line and the second conductive line. The high resistance layer may help increase an amount of an in-plane current flowing through an interface between the magnetic tunnel junction pattern and the first conductive line, and in this case, a switching property of the magnetic tunnel junction pattern MTJ may be improved.

By way of summation and review, a magnetic memory device may include a magnetic tunnel junction (MTJ) pattern. The MTJ pattern may include two magnetic layers and an insulating layer therebetween. Resistance of the MTJ pattern may vary depending on magnetization directions of the magnetic layers. For example, the resistance of the MTJ pattern may be higher when magnetization directions of the magnetic layers are anti-parallel to each other than when they are parallel to each other. Such a difference in resistance can be used for data storing/reading operations of the magnetic memory device.

Providing the magnetic memory device with higher integration density and lower power consumption properties may be considered.

One or more embodiments may provide a magnetic memory device including a magnetic tunnel junction.

One or more embodiments may provide a spin-orbit-torque-based magnetic memory device with improved switching and tunnel-magnetoresistance properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A magnetic memory device, comprising:
a lower electrode on a substrate;
a conductive line on the lower electrode; and
a magnetic tunnel junction pattern on the conductive line, wherein:
the conductive line includes:

a first conductive line adjacent to the magnetic tunnel junction pattern;
a second conductive line between the lower electrode and the first conductive line; and
a high resistance layer at least partially between the first conductive line and the second conductive line,
a resistivity of the second conductive line is lower than a resistivity of the first conductive line,
a resistivity of the high resistance layer is higher than the resistivity of the first conductive line and higher than the resistivity of the second conductive line,
at least a portion of the high resistance layer is vertically overlapped with the magnetic tunnel junction pattern,
each of the first conductive line, the second conductive line, and the high resistance layer has a thickness in a direction perpendicular to a top surface of the substrate, and
the thickness of the high resistance layer is smaller than the thickness of the first conductive line and smaller than the thickness of the second conductive line.

2. The magnetic memory device as claimed in claim 1, wherein the first conductive line includes a topological insulator.

3. The magnetic memory device as claimed in claim 2, wherein the second conductive line includes a metal or a metal alloy having a resistivity that is lower than the resistivity of the first conductive line.

4. The magnetic memory device as claimed in claim 3, wherein the high resistance layer includes an oxide.

5. The magnetic memory device as claimed in claim 1, wherein the thickness of the second conductive line is smaller than or equal to the thickness of the first conductive line.

6. The magnetic memory device as claimed in claim 1, wherein:
each of the first conductive line, the second conductive line, and the high resistance layer has a length in a direction parallel to the top surface of the substrate, and
the length of the high resistance layer is smaller than the length of the first conductive line and smaller than the length of the second conductive line.

7. The magnetic memory device as claimed in claim 1, further comprising an upper conductive line on the conductive line and horizontally spaced apart from the magnetic tunnel junction pattern,
wherein:
the conductive line extends in a first direction parallel to the top surface of the substrate,
the magnetic tunnel junction pattern is spaced apart from the upper conductive line in the first direction, and
the upper conductive line is connected to the first conductive line.

8. A magnetic memory device, comprising:
a lower electrode on a substrate;
a conductive line on the lower electrode; and
a magnetic tunnel junction pattern on the conductive line, wherein:
the conductive line includes:
a first conductive line adjacent to the magnetic tunnel junction pattern; and
a second conductive line between the lower electrode and the first conductive line,
the first conductive line includes a topological insulator,
a resistivity of the second conductive line is smaller than a resistivity of the first conductive line,
each of the first conductive line and the second conductive line extends in a first direction parallel to a top surface of the substrate, and
a length of the second conductive line in the first direction is smaller than a length of the first conductive line in the first direction.

9. The magnetic memory device as claimed in claim 8, wherein the second conductive line includes a metal or a metal alloy having a resistivity that is lower than the resistivity of the first conductive line.

10. The magnetic memory device as claimed in claim 8, wherein at least a portion of the magnetic tunnel junction pattern is not vertically overlapped with the second conductive line.

11. The magnetic memory device as claimed in claim 10, further comprising an upper conductive line on the conductive line and horizontally spaced apart from the magnetic tunnel junction pattern,
wherein:
the magnetic tunnel junction pattern is spaced apart from the upper conductive line in the first direction, and
the upper conductive line is connected to the first conductive line.

12. A magnetic memory device, comprising:
a lower electrode on a substrate;
a conductive line on the lower electrode; and
a magnetic tunnel junction pattern on the conductive line, wherein:
the conductive line includes:
a first conductive line adjacent to the magnetic tunnel junction pattern;
a second conductive line between the lower electrode and the first conductive line; and
a high resistance layer at least partially between the first conductive line and the second conductive line,
the first conductive line is configured to exert a spin-orbit torque on the magnetic tunnel junction pattern,
a resistivity of the high resistance layer is higher than a resistivity of the first conductive line and higher than a resistivity of the second conductive line,
at least a portion of the high resistance layer vertically overlaps with the magnetic tunnel junction pattern,
each of the first conductive line, the second conductive line, and the high resistance layer has a length in a direction parallel to a top surface of the substrate, and
the length of the high resistance layer is smaller than the length of the first conductive line and smaller than the length of the second conductive line.

13. The magnetic memory device as claimed in claim 12, wherein:
each of the first conductive line, the second conductive line, and the high resistance layer has a thickness in a direction perpendicular to a top surface of the substrate, and
the thickness of the high resistance layer is smaller than the thickness of the first conductive line and smaller than the thickness of the second conductive line.

14. The magnetic memory device as claimed in claim 12, wherein:
the resistivity of the second conductive line is lower than the resistivity of the first conductive line.

15. The magnetic memory device as claimed in claim 14, wherein the second conductive line includes a metal or a metal alloy having a resistivity that is lower than the resistivity of the first conductive line.

* * * * *